United States Patent [19]

Tice et al.

[11] Patent Number: 5,479,119
[45] Date of Patent: Dec. 26, 1995

[54] HIGH SPEED ACTIVE OVERVOLTAGE DETECTION AND PROTECTION FOR OVERVOLTAGE SENSITIVE CIRCUITS

[75] Inventors: Thomas E. Tice, Greensboro; David T. Crook, Summerfield; Kevin M. Kattmann; Charles D. Lane, both of Greensboro, all of N.C.

[73] Assignee: Analog Devices, Inc., Norwood, Mass.

[21] Appl. No.: 344,452

[22] Filed: Nov. 23, 1994

[51] Int. Cl.$^6$ .................................................. H03K 5/153
[52] U.S. Cl. ............................... 327/74; 327/58; 361/88; 361/90
[58] Field of Search ......................... 327/50, 58, 525, 327/545, 546, 427; 361/86, 87, 90, 91, 93; 363/16, 17, 95, 96

[56] References Cited

U.S. PATENT DOCUMENTS

| | | | |
|---|---|---|---|
| 3,800,198 | 3/1974 | Graf et al. | 318/227 |
| 4,237,509 | 12/1980 | Asplund | 361/91 |
| 4,571,656 | 2/1986 | Ruckman | 361/91 |
| 4,616,305 | 10/1986 | Damiano et al. | 363/132 |
| 4,713,740 | 12/1987 | Drabing | 363/17 |
| 4,815,052 | 3/1989 | Walker | 363/87 |
| 5,089,925 | 2/1992 | Lester | 361/91 |
| 5,111,353 | 5/1992 | Kotowski et al. | 361/91 |
| 5,325,258 | 6/1994 | Choi et al. | 361/87 |
| 5,400,237 | 3/1995 | Flanagan et al. | 363/95 |

OTHER PUBLICATIONS

Grebene, *Bipolar and MOS Analog Integrated Circuit Design*, John Wiley & Sons, 1984, pp. 835–866.
Allen et al., *CMOS Analog Circuit Design*, pp. 198–204.

*Primary Examiner*—Timothy P. Callahan
*Assistant Examiner*—Kenneth B. Wells
*Attorney, Agent, or Firm*—Koppel & Jacobs

[57] ABSTRACT

An overvoltage protection circuit protects against saturation and damage of sensitive circuitry elements. The protection circuit includes an out-of-range detector which compares an input signal to reference levels to determine if it is within a predetermined range of acceptable inputs. If the input is determined not to be within this range, a control circuit substitutes a supplemental signal within the range for the input signal. Digital correction can be provided to correct the output of the sensitive circuit element while the supplemental signal is being substituted. Numerous circuit designs may be used to implement the protection scheme.

20 Claims, 6 Drawing Sheets

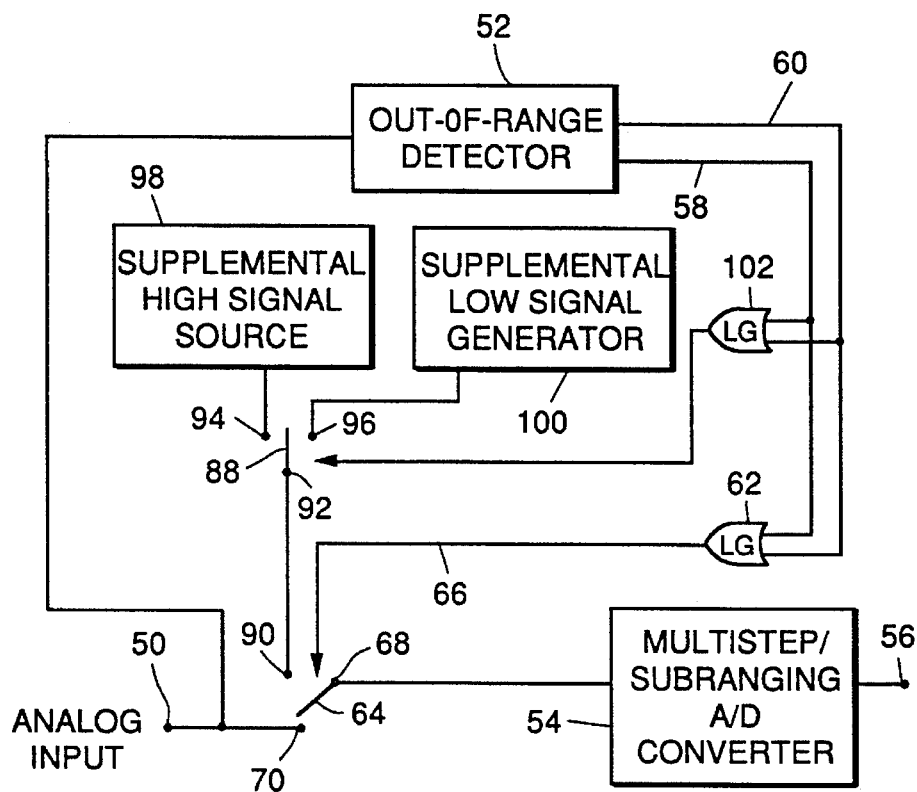
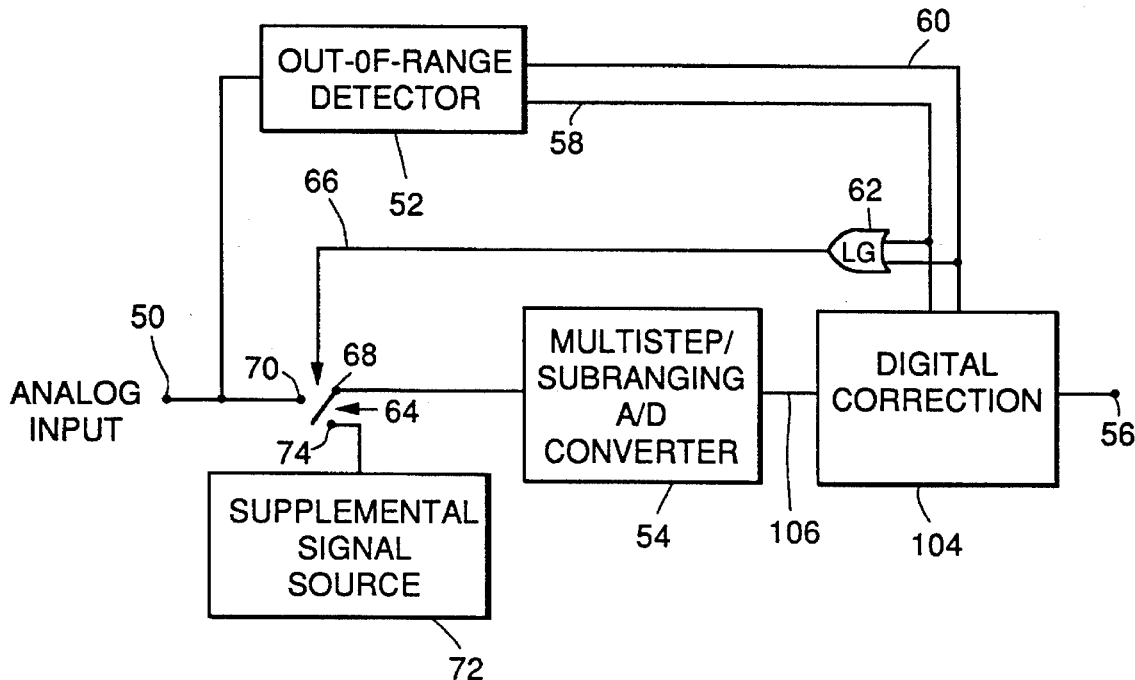
FIG. 5.
FIG. 6a.

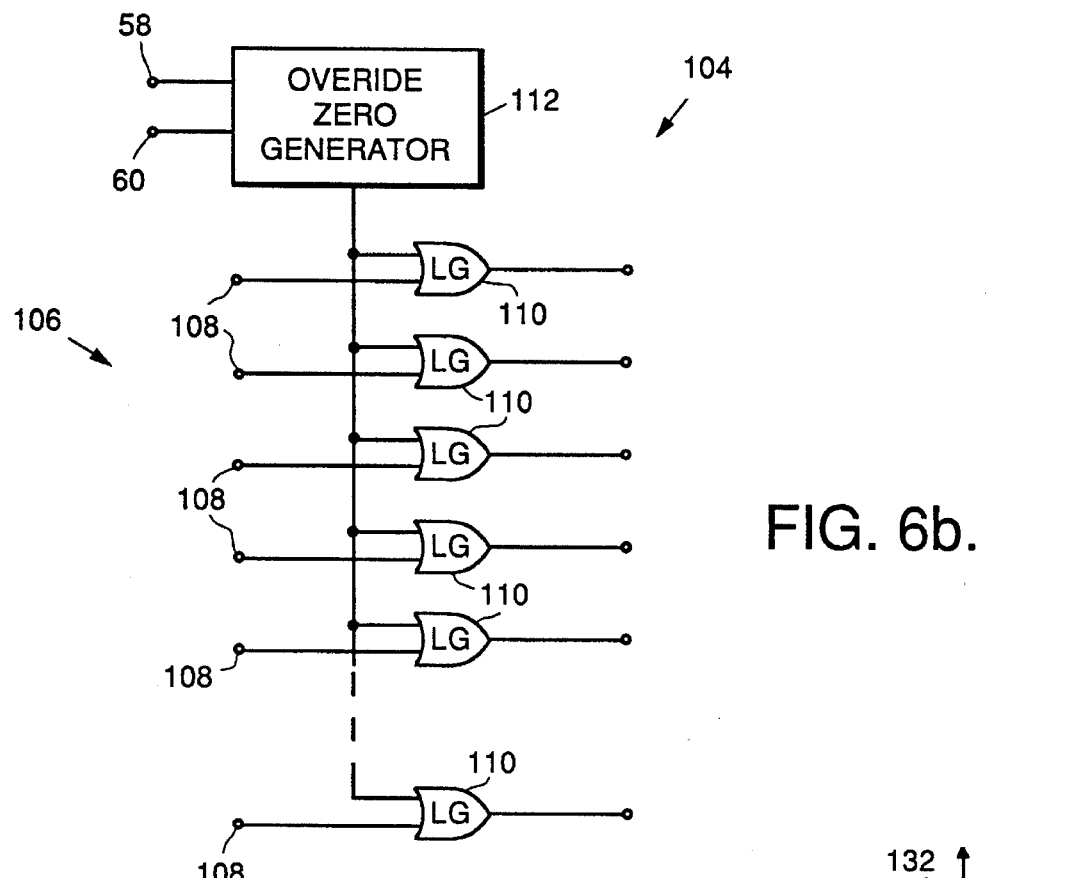
FIG. 6b.
FIG. 7b.
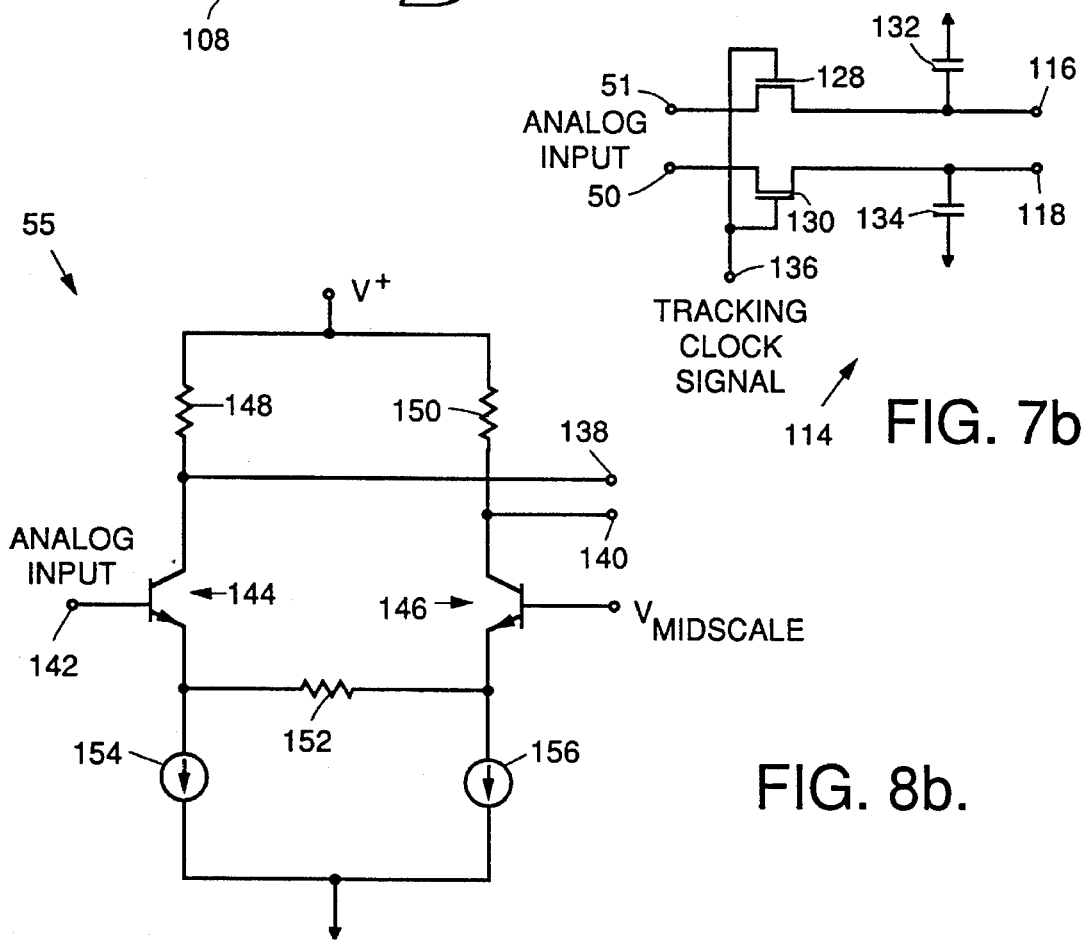
FIG. 8b.

HIGH SPEED ACTIVE OVERVOLTAGE DETECTION AND PROTECTION FOR OVERVOLTAGE SENSITIVE CIRCUITS

BACKGROUND OF THE INVENTION

1. Field of the invention

This invention relates to overvoltage detection and protection for use with overvoltage sensitive circuit elements such as high speed multistep/subranging analog to digital converters.

2. Description of the Related Art

An analog to digital (A/D) converter is a device designed to convert an analog waveform into a series of digital words. The input of such a device is generally a continuously varying voltage signal; the output is a multi-bit step voltage signal representing a digital output (ones and zeroes). Within an A/D converter the input signal is compared to multiple reference voltages at periodic time intervals (the sampling rate). These comparisons measure whether the input voltage is greater than or less than a series of reference levels, in total thereby producing an output which approximately describes the state of the varying input. Unlike the analog input which is continuous, the comparisons are characteristically quantized, and therefore have a finite resolution that corresponds to the size of the intervals between successive reference voltage levels.

An issue with analog to digital conversion is that the conversion process takes a finite amount of time, meaning that the sampling cycle cannot be set arbitrarily short to accomodate a high frequency input. There are many different types of converters with conversion times ranging from greater than one second (sampling less than once per second) to less than two nanoseconds. Different materials and designs for A/D converters are best suited for different operating speeds; the specific application typically defines the type of converter employed. Several different designs are described in Grebene, Bipolar and MOS Analog Integrated Circuit Design, John Wiley & Sons, 1984, pages 835–866.

Parallel or simultaneous A/D converters are generally regarded as some of the fastest designs. They use separate comparators in parallel for each quantization step (as opposed to using the same comparators repeatedly with changing reference voltages, or multiple comparators in series). Parallel A/D conversion is capable of completing an entire conversion operation in one step, and thus is referred to as flash conversion. FIG. 1 illustrates the basic design of an N-bit flash converter.

In the flash A/D converter shown in FIG. 1, an analog input is provided at terminal 2 and is transmitted to the variable inputs of a series of comparators 4 (there are $2^N-1$ comparators in an N-bit flash converter). A reference voltage is maintained across a series of resistors 6 from positive $V_{ref}$ terminal 8 to negative $V_{ref}$ terminal 10. These resistors 6 provide the step interval reference voltages which are applied to the reference inputs of the comparators 4. Comparators 4 compare their reference and variable input signals at time intervals determined by a sampling signal applied at terminal 12. The outputs of the $2^N-1$ comparators are combined by a decode logic subcircuit 14 to generate an N bit digital word.

To increase converter resolution with minimal increases in die area and power requirements, multiple flash converters may be combined. One such assembly is the multistep/subranging converter. A conventional multistep/subranging converter, shown in FIG. 2, divides the conversion process into two steps. An analog input is supplied at input terminal 16 and directed to a track and hold element 18. The output of the track and hold is directed to both a summing amplifier 20 and the input of a first flash converter 22. The flash converter 22 generates an output which forms the first digits (in this case 4 bits) of the digital output word. This output is transmitted to a digital-to-analog (D/A) converter 24, which converts it back into an analog signal. The analog signal output of the D/A converter 24 is directed to a summing amplifier 20 which compares it with the original input, producing a residue signal that contains the finer details of the input information not resolved by the first conversion. The residue signal is then directed to a second flash converter 26 for finer quantization. The output of the second flash converter 26 is the second half of the digital output word. If the residue signal doesn't fall exactly in the voltage range of the second flash converter, however, that converter cannot function properly and missing codes result. The residue signal is often amplified. The amplication of the residue signal increases the effective sensitivity of the second converter to overvoltage signals.

Many of the fastest A/D converters utilize bipolar junction transistors (BJTs) for their high speed capabilities. When a BJT is subject to an overvoltage it is driven out of its linear operating range into saturation. Thus the flash converters 22 and 26 are especially susceptible to overvoltages. Even if the overvoltage is mild, a BJT driven out of its linear operating range into saturation requires time to recover. The recovery time is partially dependent upon the magnitude of the overvoltage, but it is often more than several conversion cycles. Extreme overvoltages can permanently damage the converter. During saturation, missing or incorrect codes often occur.

In the prior art, such overvoltage problems were remedied with input diode clamps, e.g., Schottky diodes. An example of a prior overvoltage protection design is shown in FIG. 3a. A pair of diodes 28 and 30 respectively have their anode and cathode connected to the analog input terminal 32 of the A/D converter 34. The opposite ends of diodes 28 and 30 are connected to different voltage references 36 and 38 which are respectively illustrated as ground and a negative voltage $V_{ref}$. The different voltage references together define the limits of a range of input signals which may be transmitted to the A/D converter. When the input signal is not in the defined range one of the diodes (the diode corresponding to the range limit which is being exceeded) clamps the circuit.

With an ideal circuit, it would be possible to set the diodes' clamping voltages exactly equal to the extreme limits of the desired input range. In practice, however, diodes are not able to switch from open to conductive (clamping the circuit) abruptly within arbitrarily narrow voltage ranges. FIG. 3b illustrates the operation of a pair of typical diodes 28 and 30, having a forward bias breakdown voltage of 0.6 volts in controlling the voltage $V_{ADC}$ applied to the input of the A/D converter 34 as a function of an attempted input voltage $V_{in}$. Three distinct types of response are evident: (1) linear conduction in region 40 which corresponds to input voltages well within the limits of the conduction range, (2) constant secure clamping, in regions 42 and 44, which corresponds to input voltages well beyond the limits of the conduction range, and (3) non-linear response, in regions 46 and 48, which corresponds to input voltages near a limit of the conduction range (near a clamping voltage of one of the diodes). Without an abrupt open to conductive transition, clamp level selection involves a tradeoff between protecting the BJTs from saturating overvoltages, and preserving a linear operation. Selecting a clamp level that securely clamps before the input voltage has reached a level which saturates the BJTs results in a non-linearity that distorts the extremes of acceptable input. Conversely a clamp voltage that ensures a completely linear operation involve a diode activating forward voltage drop which exceeds the voltage necessary to saturate the BJTs.

Preserving linearity is usually of paramount importance. Departing from a linear operating range causes the converter's digital output to vary from the input signal. Furthermore, when the BJTs do return to a linear range it is necessarily from an extreme voltage level, which further delays ideal response and increases the duration of false outputs. The result of the trade-off is thus typically to preserve linearity at the cost of the transistor saturation.

SUMMARY OF THE INVENTION

The present invention seeks to provide a new circuit and method of detecting out-of-range input signals and inhibiting saturation and overvoltage damage caused by such signals in sensitive circuit elements, such as those used in high speed multistep/subranging A/D converters. The invention further seeks to provide, to those sensitive elements, a supplemental signal which becomes the input for the duration of the out-of-range condition.

These objectives are achieved with an active overvoltage input signal detector, which determines if the input signal is within a predetermined acceptable range; a supplemental signal source, which produces a signal within the predetermined range; and a control circuit which responds to the detector determining that the input signal is outside the acceptable range and substitutes the supplemental signal for the out-of-range signal as the input to the sensitive circuit element. In a preferred embodiment, the control circuit includes logic gates which respond to the detector determination and control switches which substitute the supplemental signal for the out-of-range signal. In another preferred embodiment, an output correction is included which responds to the detector determination and corrects the output of the sensitive element.

Multiple layers of this type of protection circuitry may be employed to separately protect input buffers, multiple flash converters, signal processing elements, and other protection circuitry of the same type having multiple fragile input signal detectors.

These and other features and advantages of the invention will be apparent to those skilled in the art from the following detailed description, taken together with the accompanying drawings.

BRIEF DESCRIPTION OF THE DRAWINGS

FIG. 3a, described above, is a block diagram of a passive clamping type overvoltage protection circuit, while FIG. 3b is a output voltage plot of a pair of clamping diodes in a circuit relationship of the type illustrated in FIG. 3a.

FIG. 4a is a block diagram of an overvoltage protection circuit according to the principles of the present invention, while FIG. 4b is a schematic diagram of an out-of-range overvoltage detector shown in FIG. 4a.

FIG. 5 is a block diagram of an alternate embodiment of the overvoltage protection circuit of FIG. 4a.

FIG. 6a is a block diagram illustrating an alternate embodiment of the overvoltage protection circuit of FIG. 4a, while FIG. 6b is a schematic diagram of a digital correction circuit shown in FIG. 6a.

FIG. 7a is a block diagram of an overvoltage protection circuit that shows another aspect of the present invention, while FIG. 7b is a schematic diagram of a track and hold element shown in FIG. 7a.

FIG. 8a is a block diagram of a dual stage overvoltage protection circuit in accordance with the embodiments illustrated in FIGS. 4a and 7a, while FIG. 8b is a schematic diagram of a buffer circuit shown in FIG. 8a.

DETAILED DESCRIPTION OF THE INVENTION

While the invention is described herein in connection with multistep/subranging A/D converters, it is also applicable to the protection of other overvoltage sensitive circuit elements. Accordingly, references to specific overvoltage sensitive circuit elements are to be understood as being illustrative and exemplary of specific embodiments within the broad scope of the invention, and not as limiting of that broad scope. Like numbers refer to like elements.

Figure 1:
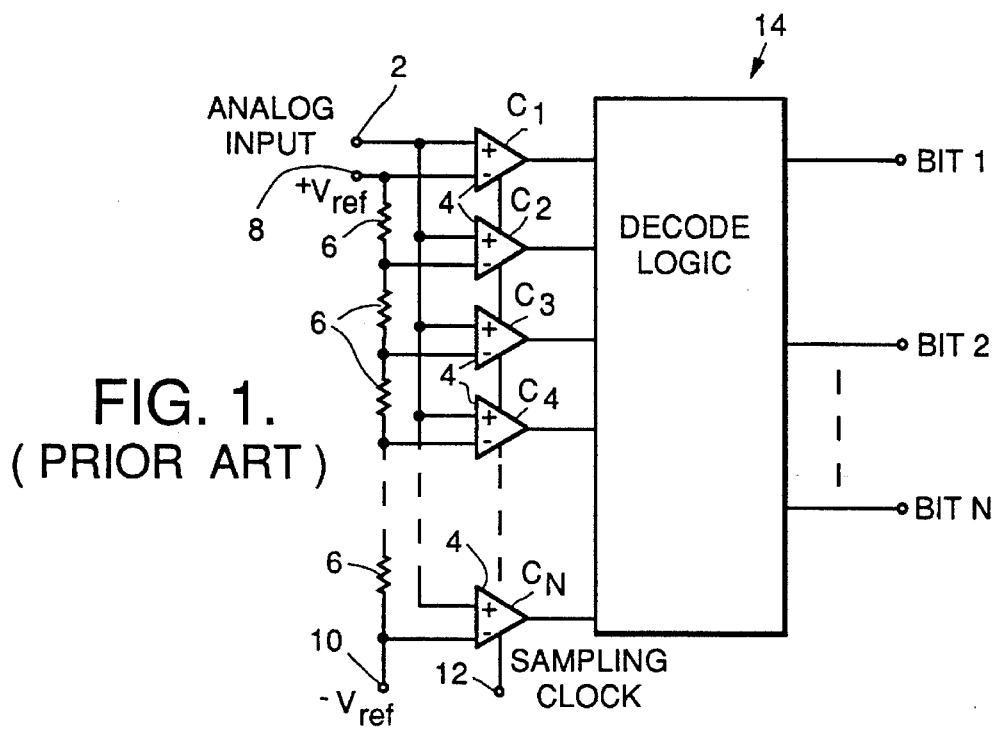
FIG. 1, described above, is a block diagram of an N-bit parallel A/D coverter.
Figure 2:
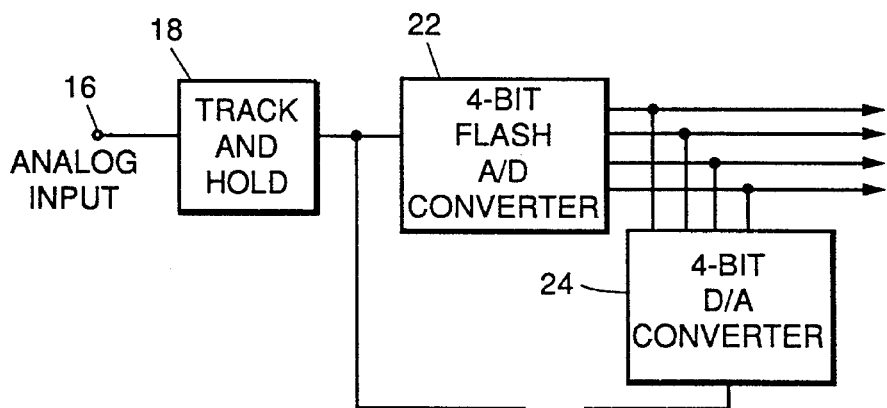
FIG. 2, described above, is a block diagram of a prior 8-bit subranging A/D converter.
Figure 3A:
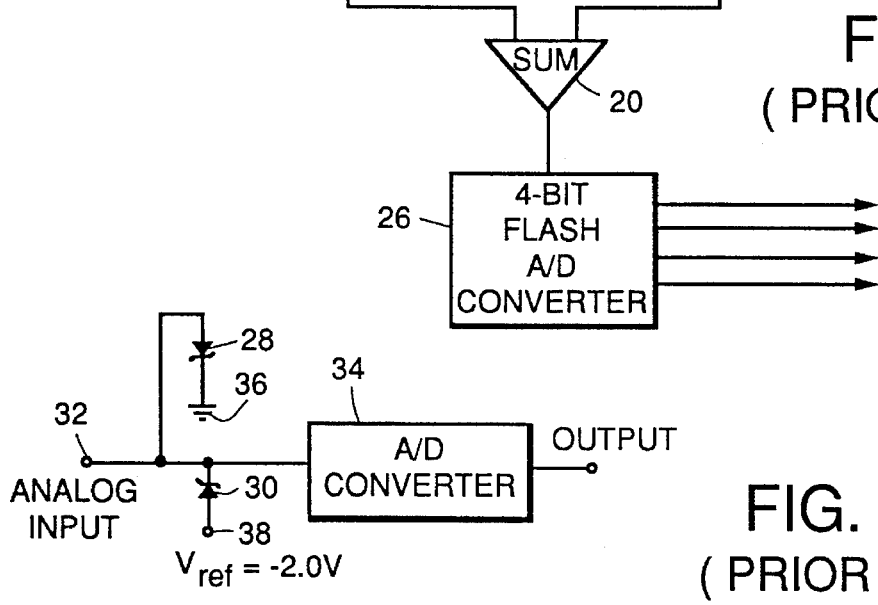
Figure 3B:
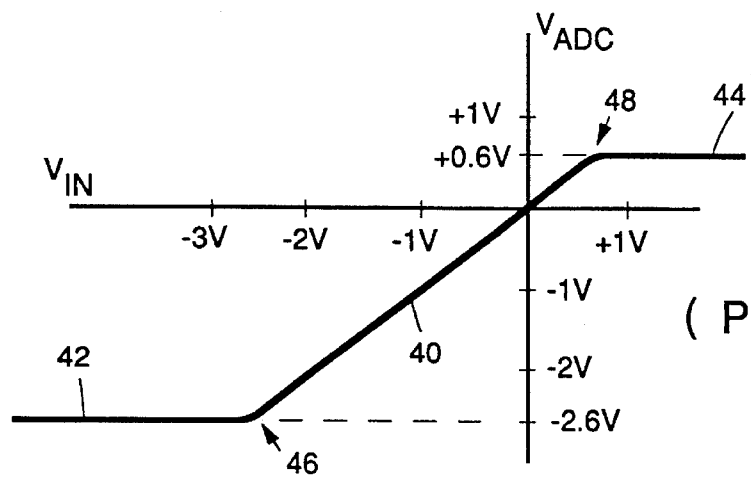
Figure 4A:
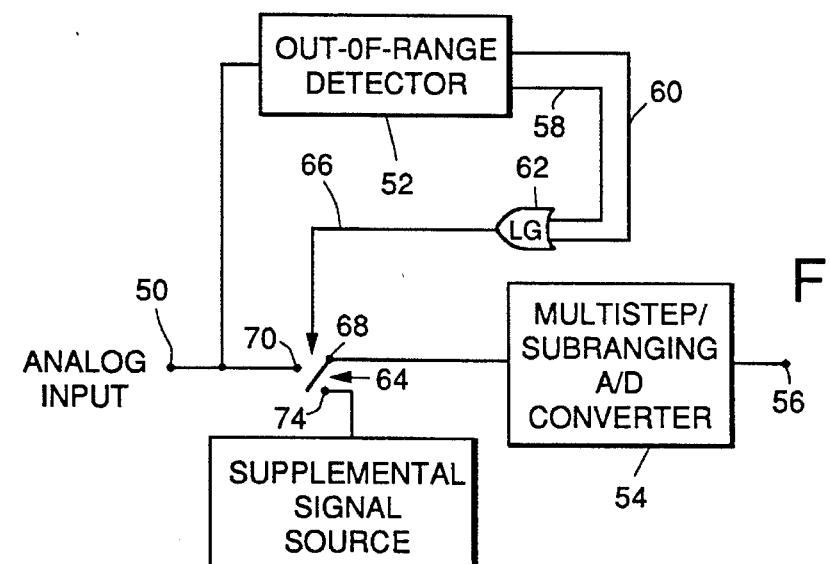

FIG. 4a illustrates the basic approach to overvoltage detection and circuit protection taken by the present invention, which is to preemptively disconnect overvoltage input signals from a sensitive circuit element or elements before the overvoltage can saturate, damage or delay them. An analog input signal is supplied to the circuit at input terminal 50. An out-of-range overvoltage detector 52 receives the input signal and determines whether the input is out of the operating voltage range of a specific subcircuit element 54 (such as a multistep/subranging A/D converter which uses bipolar junction transistors) or of other elements which may be connected beyond an output terminal 56.

The output of the detector 52 is transmitted along dual detector output signal lines 58 and 60 to a control circuit. The control circuit of this embodiment includes a logic gate 62 (which is an OR gate) and a switch 64. Logic gate 62 produces a signal, in response to the output of the detector 52, which is transmitted along line 66, to switch 64 (a switch of the type used in these embodiments is described in Allen et al., CMOS Analog Circuit Design, p.198–204). The fixed terminal 68 of switch 64 is connected as a direct input for an overvoltage sensitive subcircuit element 54, which is illustrated as a multistep/subranging A/D converter. When the detector 52 determines that the input signal is within the proper range it causes the switch 64 to connect to terminal 70, which is tied to the input terminal 50, thereby providing a true analog input to the overvoltage sensitive subcircuit element 54. If the input signal is determined by the detector 52 to be out of range, such as by sensing an overvoltage at the input, a signal is transmitted by the detector 52 that induces logic gate 62 to produce an output which causes the switch to disconnect the subcircuit element 54 from the true analog input, and instead to connect it to the output of a supplemental signal source 72 (a voltage generator in the preferred embodiment) at supplemental signal terminal 74. The supplemental signal source 72 maintains an acceptable input signal voltage for the subcircuit element 54 for the duration of the input overvoltage condition. In a preferred embodiment the supplemental signal source provides a signal at midscale voltage from which the subcircuit element 54 continues to operate once it has been disconnected from the true analog input 50. The midscale signal is characterized by a voltage near the middle of the range of acceptable input. In a preferred embodiment, in which a multistep/ subranging A/D converter is the sensitive circuit element, the acceptable input signal range is between 3 and 4 Volts, the midscale being 3.5 Volts. The output of subcircuit element 54 is applied to the output terminal 56.

Figure 4B:
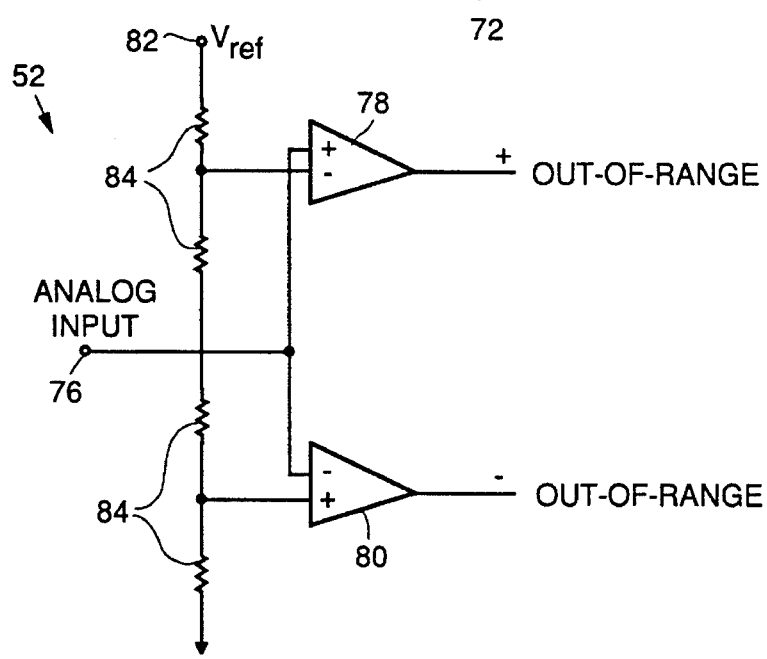

The determination of whether the input signal is out of the operating voltage range is made by comparators, within the out-of-range detector 52, which have a high common mode input range and inputs free from overvoltage recovery problems. Comparators of this type can be designed with different transistor types, such as bipolar or metal oxide semiconductor field effect transistors (MOSFETs). FIG. 4b illustrates the components and function of one possible configuration of the out-of-range detector 52.

Referring to FIG. 4b the analog input at terminal 76 is directed to variable inputs of comparators 78 and 80. The comparators compare the input signal with predetermined reference voltage levels to determine whether the signal exceeds an acceptable range. One comparator 78 determines if the signal exceeds the upper limit of the range, while the other comparator 80 determines if the signal exceeds the lower limit. The reference voltages for the comparators 78 and 80 can be supplied in numerous ways, such as by a voltage source 82 that sets the reference levels through a series of voltage divider resistors 84. Since the comparators are designed with a high common mode input range, they are relatively free of overvoltage recovery problems.

FIG. 5 illustrates another aspect of the present invention which includes a variation of the supplemental signal source and the control circuit of the embodiment illustrated in FIG. 4a. An analog voltage input is received by the circuit at input terminal 50 and is determined to be either in or out of range by a detector 52 and, if it is out of range, then whether the voltage is above or below the acceptable range (in the manner described with reference to FIG. 4b). The determination made by detector 52 is transmitted over dual detector output signal lines 58 and 60 to a control circuit. The control circuit of this embodiment includes OR gate logic elements 62 and 102, which control switches 64 and 88, respectively. As in the embodiment shown in FIG. 4a, the fixed terminal 68 of switch 64 is connected as a direct input for the overvoltage sensitive subcircuit element 54.

If the input signal is within the acceptable voltage range for an overvoltage sensitive subcircuit element 54 (such as a multistep/subranging A/D converter) the signal from OR gate 62 causes switch 64 to connect the element 54 to the true analog input signal at input terminal 70. If the input signal is out of range, OR gate 62 causes switch 64 to disconnect subcircuit element 54 from the true input and connect it instead to a terminal 90 that is connected to the fixed terminal 92 of the other switch 88. This switch 88 is connectable to either terminal 94 or terminal 96, which are respectively connected to alternative supplemental signal sources 98 and 100. The OR gate 102, which also responds to the output of detector 52, controls the decision of which signal source is connected by switch 88 to the switch terminal 92. If detector 52 determines that the input signal is beyond the lower limit of acceptable voltage, OR gate 102 causes switch 88 to connect to supplemental signal source 100, which is a voltage input at the lower limit of acceptable input for the subcircuit element 54. If the input voltage is determined to be beyond the upper limit of acceptable voltage, the supplemental signal source 98, which provides a voltage input which is at the upper limit of acceptable input, is connected instead. The purpose of including alternative supplemental signal sources, which provide inputs at the upper and lower voltage limits of the acceptable input signal range, is to provide an artificial input signal to the overvoltage sensitive subcircuit which is more reflective of the true state of the analog input than the mid-scale input level of FIG. 4a.

FIG. 6a shows an embodiment of the invention that is similar to FIG. 4a, but also includes an output digital correction circuit 104. In contrast to FIG. 5, which attempts to correct the converter's output by the use of alternative high and low voltage signal sources 98 and 100, the circuit of FIG. 6a achieves an output correction by an output digital correction circuit 104.

As with the out-of-range detector 52 of FIG. 5, detector output, transmitted along lines 58 and 60, includes information about which extreme limit of the acceptable voltage input range has been exceeded by an overvoltage. Digital correction circuit 104 is connected to lines 58 and 60, receiving therefrom the input signal information and correcting the output signal of element 54 which it receives via a connection line 106.

FIG. 6b illustrates the components and function of one possible digital correction circuit. A digital output word which requires correction is transmitted to the correction circuit 104 at terminals 108, each of which receive one bit of the digital word. The bits are transmitted to an array of OR gates 110 which, when supplied with a correcting signal, alter the bits. The correcting signal is supplied by an override zero generator element 112. The generator element 112 includes an additional pair of OR gates, which receive the detector output from lines 58 and 60, and a digital signal generator which selectively transmits an overriding digital signal to the array of OR gates in accordance with the detector output.

Figure 7A:
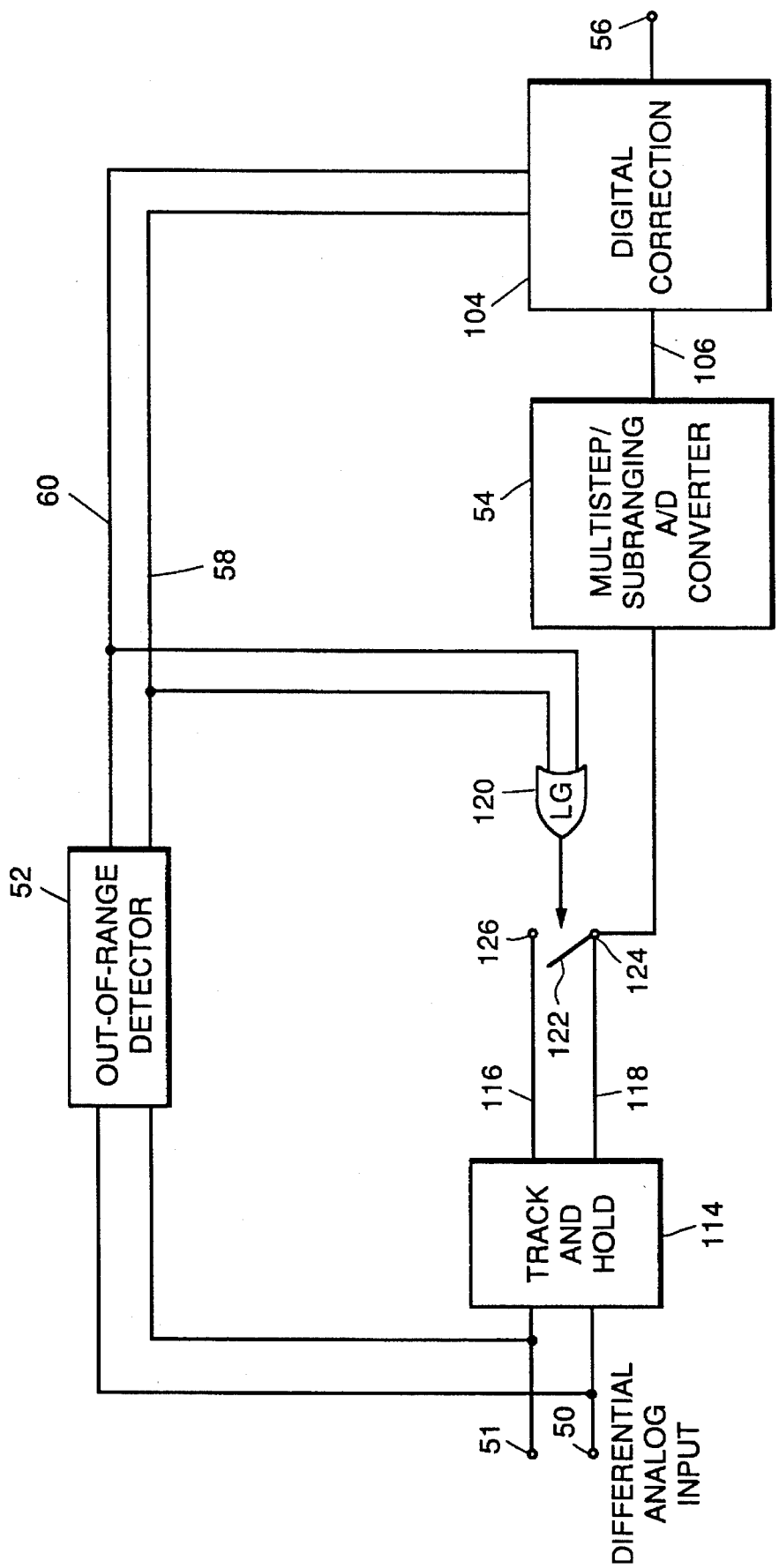

FIG. 7a shows another variation of the overvoltage protection scheme, in which a differential input signal (a true signal and an inverted counterpart) is provided at input terminals 50 and 51. This differential input signal is applied directly to a subcircuit element 114 which is less susceptible to overvoltage damage. In FIG. 7a subcircuit element 114 is a track and hold circuit.

Track and hold element 114 has differential output lines 116 and 118, with the latter line providing an input to the sensitive subcircuit element 54. The differential input signal is also connected to an out-of-range detector 52. The output of detector 52 is transmitted over lines 58 and 60 to a control circuit including an OR gate logic element 120, which controls a switch 122 that includes a fixed terminal 124. When the detector senses no overvoltage, switch 122 remains open and sensitive subcircuit element 54 receives the output of subcircuit element 114 from output line 118 through switch terminal 124. If an overvoltage is detected by the detector 52, switch 122 shorts the differential outputs 116 and 118 of subcircuit element 114 (across switch terminals 124 and 126). By shorting the differential output, a midscale signal is generated which supplies subcircuit element 54. The midscale signal protects the element 54 from the overvoltage. To ensure an appropriate digital output from the converter at output terminal 56 throughout the overvoltage condition, a digital correction element 104 is provided which is actuated by detector output signal lines 58 and 60 in the same manner as element 104 of FIGS. 6a and 6b.

The circuit of FIG. 7a is also applicable to a single ended as opposed to differential analog input, so long as the output of subcircuit element 114 is differential (and thereby shortable to generate a midscale signal).

FIG. 7b illustrates the components and function of one possible track and hold circuit. A pair of tracking switches 128 and 130 connect the differential inputs at terminals 50 and 51 to respective holding capacitors 132 and 134, and also to respective output lines 116 and 118. A tracking clock signal, introduced at terminal 136, controls the switches 128 and 130 to close and open in synchronism in a regular pattern. When the switches are closed a true input is transmitted through the circuit to output lines 116 and 118, and the voltage levels of holding capacitors 132 and 134 track the differential signal inputs. When the tracking clock signal causes switches 128 and 130 to open, the charged holding capacitors maintain the voltage levels of each line as they were immediately prior to the switches opening. Closing the shorting switch 122 shown in FIG. 7a connects the capacitors 132 and 134 to produce the midrange signal at this juncture.

Figure 8A:
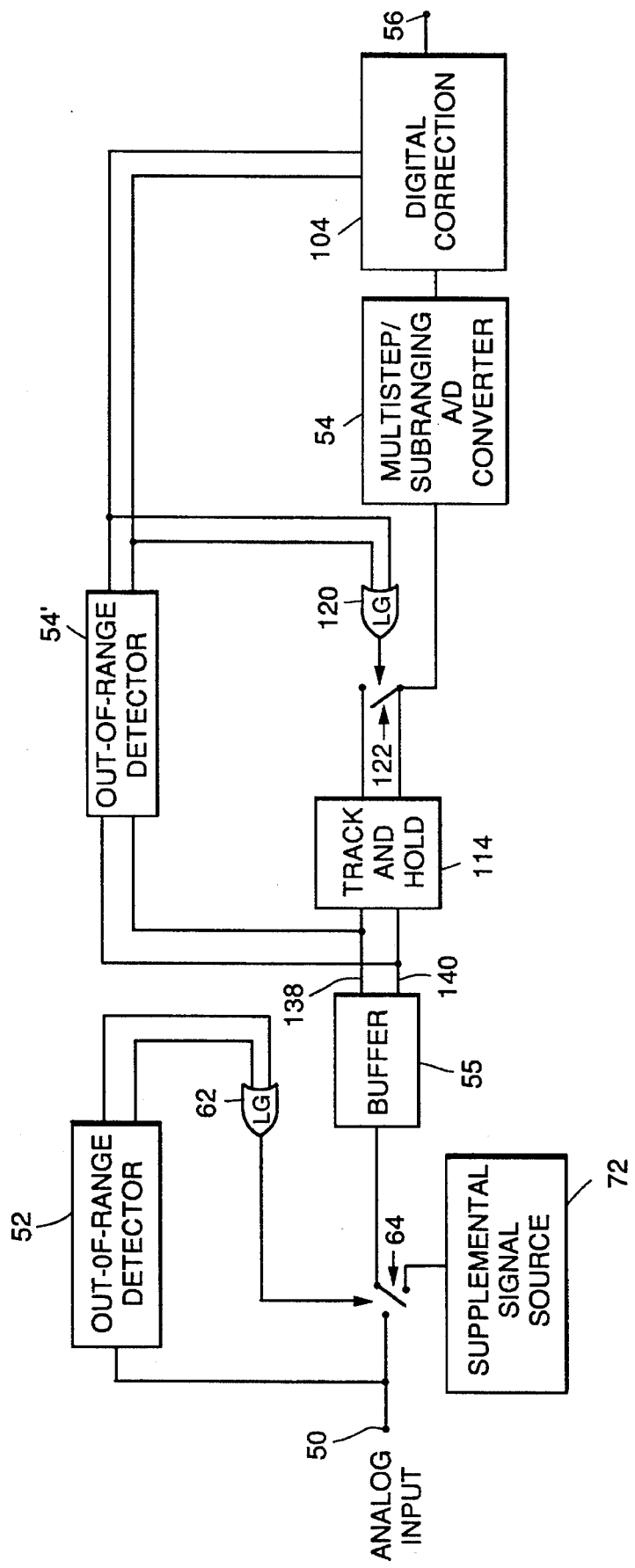

Multiple protection circuits can be used for circuits that include more than one overvoltage sensitive element. Depending upon the particular application, either the same type of protection circuit can be used for each sensitive element, or different protection schemes can be used for different elements. For example, FIG. 8a shows a circuit that includes two overvoltage sensitive subcircuit elements 54 and 55 that are protected by the types of protection circuits shown in FIGS. 4a and 7a, respectively. Element 55 in this circuit is a circuit buffer (shown in FIG. 8b) having a single line input and a differential output.

The second stage of the circuit, which begins at differential output signal lines 138 and 140 from element 55, is identical to input lines 50 and 51 of the embodiment described in reference to FIG. 7a, and provides a second (and potentially different voltage range) protection to element 54. As is the case with the FIG. 7a circuit, there is no relevant distinction between whether the output of element 55 (which becomes the input to the second stage of the circuit) is differential or not so long as the output of element 114 is differential.

FIG. 8b illustrates the components and function of one possible buffer circuit element which produces a differential output. An analog input is received by buffer circuit 55 at input terminal 142 (which may be tied to either the fixed terminal 68 of switch 64, as shown in FIG. 4a, or to any other suitable input signal source). The input terminal 142 is tied to the base of a transistor 144. A midscale voltage is applied to the base of a second transistor 146. The collectors of transistors 144 and 146 are connected to resistors 148 and 150 respectively, and their emitters are connected to each other across a resistor 152. Current sources 154 and 156 regulate the current flowing through each transistor. When the analog signal at the base of transistor 144 differs from the midscale voltage applied to the base of the second transistor 146, a current begins to flow through resistor 152. The current flowing through resistor 152 either adds to or substracts from the constant current source 154 and does the opposite to constant current source 156, and thereby causes the voltage across resistor 148 move in one direction while the voltage across resistor 150 moves in the opposite direction with the same magnitude (assuming equal value resistors). A differential voltage signal is thus produced between the collectors of the transistor pair, and is transmitted along lines 138 and 140.

While particular embodiments of the invention have been shown and described, numerous variations and alternate embodiments will occur to those skilled in the art. Accordingly, it is intended that the invention be limited only in terms of the appended claims.

We claim:

1. An overvoltage protection circuit for a circuit element which receives an input voltage signal and is subject to improper functioning when said input voltage signal goes outside a predetermined signal range, comprising:

an out-of-range signal detector that produces an actuating signal when said input signal to said circuit element is outside said range, a supplementary signal source that provides a supplementary signal within said range, and a control circuit that is connected to receive said actuating signal and, in response to the presence of said actuating signal, to connect said supplementary signal source to said circuit element to substitute said supplementary signal for said input signal as the input to said circuit element, wherein said circuit element provides a digital output, said protection circuit further comprising a digital correction circuit element that is connected to receive said actuating signal and to correct the digital output of said circuit element in response to the presence of said actuating signal.

2. The overvoltage protection circuit of claim 1, wherein the control circuit comprises a switch which disconnects said input signal from said element when said signal goes out of range, and connects said supplementary signal to said element.

3. The overvoltage protection circuit of claim 2, wherein the control circuit further comprises a logic gate which is connected to receive said actuating signal and to control said switch.

4. The overvoltage protection circuit of claim 1, wherein said circuit element comprises a bipolar junction transistor circuit.

5. The overvoltage protection circuit of claim 1, wherein said circuit element is a multistep/sub-ranging analog to digital converter.

6. The overvoltage protection circuit of claim 7, said signal range having upper and lower limits, wherein said supplementary signal source provides said supplementary signal as a midscale signal at approximately a median level between said upper and lower limits.

7. An overvoltage protection circuit for a circuit element which receives an input voltage signal and is subject to improper functioning when said input voltage signal goes outside a predetermined signal range, comprising:

an out-of-range signal detector that produces an actuating signal when said input signal to said circuit element is outside said range, said actuating signal indicating whether the input signal is at a level above or below said range, a pair of supplementary signal sources that provide supplementary signals having values at approximately the upper and lower limits of said range, and a control circuit that is connected to receive said actuating signal and, in response to the presence of said actuating signal, to connect one of said supplementary signal sources to said circuit element to substitute a supplementary signal at approximately the upper limit of said range as the input to said element when said input signal is at a level above said range, and to substitute a supplementary signal at approximately the lower limit of said range as the input to said element when said input signal is at a level below said range.

8. The overvoltage protection circuit of claim 7, wherein the control circuit comprises a first switch which disconnects said input signal from said element when said signal goes out of range and connects a selected supplementary signal to said element.

9. The overvoltage protection circuit of claim 8, further comprising a second switch connected to connect a selected one of said supplementary signal sources to said first switch to provide a selected supplementary signal to said element through said first switch.

10. The overvoltage protection circuit of claim 9, wherein the control circuit further comprises a plurality of logic gates which are connected to receive said actuating signal and to control respective ones of said switches in response to the presence or absence of said actuating signal.

11. The overvoltage protection circuit of claim 8, wherein the control circuit further comprises a logic gate which is connected to receive said actuating signal and to control said first switch.

12. The overvoltage protection circuit of claim 7, wherein said circuit element comprises a bipolar junction transistor circuit.

13. The overvoltage protection circuit of claim 7, wherein said circuit element is a multistep/sub-ranging analog to digital converter.

14. An overvoltage protection circuit for a circuit element which receives an input voltage signal and is subject to improper functioning when said input voltage signal goes outside a predetermined signal range, comprising:

an out-of-range signal detector that produces an actuating signal when said input signal is outside said range, a differential output circuit element which is connected to receive said input signal and to output a differential signal having components consisting of said input signal and an inverted form of said input signal, and a control circuit that is connected to receive said actuating signal and, in response to the presence of said actuating signal, to short together the components of said differential signal to produce a midscale signal within said signal range, and to substitute said midscale signal as the input to said circuit element, wherein said circuit element provides a digital output, said protection circuit further comprising a digital correction circuit element that is connected to receive said actuating signal and to correct the digital output of the said circuit element in response to the presence of said actuating signal.

15. The overvoltage protection circuit of claim 14, wherein the control circuit comprises a switch which shorts together the components of said differential signal.

16. The overvoltage protection circuit of claim 15, wherein the control circuit further comprises a logic gate which is connected to receive said actuating signal and to control said switch.

17. The overvoltage protection circuit of claim 14, wherein said circuit element comprises a bipolar junction transistor circuit.

18. The overvoltage protection circuit of claim 14, wherein said circuit element is a multistep/sub-ranging analog-to-digital converter.

19. A method of protecting a circuit element which receives an input voltage signal and is subject to improper functioning when said input voltage signal goes outside a predetermined range, comprising:

determining whether said input signal is outside said range, producing an actuating signal when said input signal is determined to be outside said range, disconnecting said input signal from said element and providing a supplemental signal within said range to said element in response to the presence of said actuating signal, and correcting a digital output of said circuit element in response to said out-of-range determination.

20. A method of protecting a circuit element which receives an input voltage signal and is subject to improper functioning when said input voltage signal goes outside a predetermined range, comprising:

determining whether said input signal is outside said range, producing a first actuating signal when said input signal is determined to be at a level above said range and a second actuating signal when said input signal is determined to be at a level below said range, substituting a supplementary signal at approximately the upper limit of said range for said input signal as an input to said circuit element in response to the presence of said first actuating signal, and substituting a supplementary signal at approximately the lower limit of said range for said input signal as an input to said circuit element in response to the presence of said second actuating signal.

* * * * *